(12) United States Patent
Bahl et al.

(10) Patent No.: US 8,917,123 B2
(45) Date of Patent: Dec. 23, 2014

(54) INTEGRATED CIRCUIT WITH REDUCED POWER CONSUMPTION IN A TEST MODE, AND RELATED METHODS

(71) Applicant: STMicroelectronics International N.V., Amsterdam (NL)

(72) Inventors: Swapnil Bahl, New Delhi (IN); Shray Khullar, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/853,247

(22) Filed: Mar. 29, 2013

(65) Prior Publication Data

US 2014/0292385 A1 Oct. 2, 2014

(51) Int. Cl.
*H03L 7/00* (2006.01)
*H03K 3/012* (2006.01)

(52) U.S. Cl.
CPC ..................................... *H03K 3/012* (2013.01)
USPC ........................... 327/144; 327/145; 327/152

(58) Field of Classification Search
USPC .............. 327/141, 144–163; 331/1/A, 15–17; 375/373–376
See application file for complete search history.

(56) References Cited

U.S. PATENT DOCUMENTS

| | | | |
|---|---|---|---|
| 6,384,657 B1 * | 5/2002 | Dobos ............................ | 327/294 |
| 6,847,255 B2 * | 1/2005 | Petrovic et al. ................ | 329/323 |
| 6,919,749 B2 * | 7/2005 | Alon et al. ..................... | 327/277 |
| 7,210,082 B1 | 4/2007 | Abdel-Hafez et al. | |
| 7,746,136 B2 * | 6/2010 | Demone ........................ | 327/158 |
| 7,937,634 B2 | 5/2011 | Almukhaizim et al. | |
| 8,321,729 B2 | 11/2012 | Saxena et al. | |
| 2008/0091995 A1 | 4/2008 | Baik et al. | |
| 2008/0092002 A1 | 4/2008 | Shimooka | |
| 2008/0172587 A1 | 7/2008 | Douskey | |
| 2008/0284476 A1 * | 11/2008 | Kwan et al. .................... | 327/156 |
| 2009/0033381 A1 * | 2/2009 | Lee et al. ........................ | 327/156 |
| 2010/0117706 A1 * | 5/2010 | Stojanovic et al. ........... | 327/306 |
| 2010/0211839 A1 * | 8/2010 | Almukhaizim et al. ...... | 714/729 |
| 2011/0018596 A1 * | 1/2011 | Lee et al. ....................... | 327/156 |
| 2011/0140734 A1 | 6/2011 | Miyase et al. | |
| 2012/0166860 A1 | 6/2012 | Khullar et al. | |

OTHER PUBLICATIONS

Ravikumar et al. "Test Strategies for Low Power Devices" 978-3-9810801-3-1/2008 EDAA.
Bahl et al. "Peak Power Reduction Technique for Low Power Scan Test" Technology Research and Development STMicroelectronics Noida, India, 2007.
Vorisek et al. "At-Speed Testing of SOC ICs" 1530-1591/04 2004 IEEE.
Li et al. "On Reducing Both Shift and Capture Power for Scan-Based Testing", 2008.

* cited by examiner

*Primary Examiner* — Brandon S Cole
(74) *Attorney, Agent, or Firm* — Allen, Dyer, Doppelt, Milbrath & Gilchrist, P.A.

(57) ABSTRACT

An integrated circuit includes an N number of functional logic blocks, with N being greater than or equal to two, and clock staggering test circuitry. When the clock staggering test circuitry is in a shift mode, N staggered shift clock signals are generated for respective ones of the N functional logic blocks. Each of the N staggered shift clock signals has a frequency equal to a frequency of an external test clock signal divided by M, where M is greater than or equal to N. The peak power of the integrated circuit is reduced during the shift mode as a result of the staggered shift clock signals.

20 Claims, 7 Drawing Sheets

INTEGRATED CIRCUIT WITH REDUCED POWER CONSUMPTION IN A TEST MODE, AND RELATED METHODS

FIELD OF THE INVENTION

The present invention relates to the field of integrated circuits, and more particularly, to an integrated circuit with reduced power consumption during shift and capture modes of a scan-based test, and related methods.

BACKGROUND

For integrated circuits, power consumption is not only an issue in a functional mode but also in a test mode. Scan-based testing is a widely adopted test strategy for integrated circuits. An integrated circuit's power dissipation during scan testing can be significantly higher than that during normal operation. In a full-scan circuit, it is possible that the test power consumption exceeds the circuit's power rating in both a shift mode and a capture mode.

The difference in power consumption between a test mode and a normal functional mode is because test patterns in the test mode can switch as many nodes as possible while the normal functional mode typically activates a much fewer number of modules at a given time.

Another reason in the difference in power consumption between the test mode and the normal functional made is that successive functional input vectors applied to an integrated circuit during the normal functional mode have a significant correlation, while the correlation between consecutive test patterns can be very low.

Power consumption during the test mode thus has two main components: average power and peak power. Average power is the total distribution of power over a time period, which is generally the amount of power consumed during the application of a test. An elevated average power adds to the thermal load that is to be vented away from the circuit under test. An increased thermal load may cause structural damage to the silicon (hot spots), to bonding wires or to the package. Other thermal effects such as hot-carrier-induced defects, electro migration and dielectric breakdown are accelerated gradually and may affect performance or cause failures over time. This is especially a serious problem for low-power circuits, which usually have low heat dissipation limits. All of the above cause circuit reliability concerns.

Peak power is the highest permissible value of power at any given instant. The peak power determines the thermal and electrical limits of components and the system packaging requirements. If wafer probes have higher inductance than supply pins, a resulting excessive power/ground noise can erroneously change behavior of the circuit. As a result, correct functioning of the entire circuit is no longer insured. Further, an unanticipated voltage drop may also cause the circuits to run at a lower speed, thus leading to performance failures. For example, a worst case voltage drop of 10% can increase the circuit delay by up to 15%.

Generally, peak power consumption during a shift mode occurs with the simultaneous toggling of shift clocks. In the shift mode, the complete clock network feeding the scan flip-flops toggles as all the clock gating cells are in a transparent mode. The flip-flop switching activity also adds to the power consumption.

In a full-scan design, where all clocks are applied simultaneously, this typically occurs at the point during the load/unload process where the largest number of differences between adjacent scan cells exist. This typically occurs during the first unload cycle, right after capture cycles. Average power consumption during the shift mode is equal to the sum of the power consumptions over all the shift cycles, divided by the total number of shift cycles. Both peak and average power consumption should be managed during the shift mode, since peak power consumption can cause power line drop, while average power consumption can cause overheating to occur over time.

During the capture mode, the power consumption may exceed the limit as the switching activity can be much higher as compared to a normal functional mode. A higher peak power during the capture mode can contribute enough of a current-resistance (IR) drop to cause false logic values to transition within the capture time window causing the test pattern to fail. Although this issue is associated with both stuck-at and transition delay tests, it is more common in delay-dependent at-speed transition test patterns.

In current low power designs, there are different strategies to reduce power consumption during the functional mode. Clock gating, multi-supply voltage and power shut-off techniques are widely used for power management. For the test mode, the power can be reduced both by hardware and software techniques.

A number of approaches have been used for reducing power consumption during test. These approaches include over-sizing power supply and package cooling to withstand the increased current during testing, or reducing the test operation frequency. Unfortunately, these approaches increase either hardware cost or test time and may lead to a loss of test coverage as at-speed defects may be masked.

Other approaches for reducing power consumption during test include reducing the switching activities to levels comparable with the functional modes. Test scheduling algorithms, for example, may be used to determine the functional logic blocks of a complex design to be activated in parallel at each stage of the test session to reduce the number of concurrently tested modules. The average test power is reduced but the total test time is increased. Low power automatic test pattern generation (ATPG) algorithms generate test patterns to reduce test power in addition to the traditional ATPG objectives of fault coverage and test length. Clock gating for capture power reduction has also been used. A clock disabling technique utilizes clock gating cells to keep some scan flip-flops in stable states.

Another approach is based on dynamic scan chain partitioning, as disclosed in U.S. Pat. No. 7,937,634. Peak power is reduced by dynamically partitioning scan chains into multiple groups, wherein transitions are equally distributed among these multiple groups. For each test pattern, a particular partitioning that leads to the even partitioning of the transitions is computed by analyzing the transition distribution of the pattern. The scan chain partitioning is formulated using an Integer Linear Programming (ILP) and an efficient greedy heuristic. The computed information is loaded into the reconfigurable scan chain partitioning hardware during the capture window. The partitioning hardware is composed of controllable clock gating logic, which is reconfigured on a per pattern basis, wherein the reconfiguration is effected by only utilizing the existing scan channels.

Another approach is based on based on a selected clock order in a selected capture operation, as disclosed in U.S. Pat. No. 7,210,082. In this approach, the RTL (register-transfer level) or Gate-Level HDL (hardware description language) code is compiled based on the Input Constraints and a Foundry Library into a Sequential Circuit Model. The Sequential Circuit Model is then transformed into an equivalent Combinational Circuit Model for performing Forward and/or Backward Clock Analysis to determine the driving and observing clocks for all inputs and outputs of all combinational logic gates in the Combinational Circuit Model. The analysis results are used for Uncontrollable/Unobservable Labeling of selected inputs and outputs of the combinational logic gates. Finally, ATPG and/or Fault Simulation are performed according to the Uncontrollable/Unobservable Labeling to generate the HDL Test Benches and ATE Test Programs.

Scan chain and pattern re-ordering techniques to reduce the shift mode power have also been used to reduce power consumption during the test mode. These techniques modify either the order in which test patterns of a given test sequence are applied to the chip or the order in which the scan flip-flops are chained to form the scan chain. These techniques inherently require extra computations, thereby adding to the overall complexity. Experimental results show that scan cell ordering can reduce test power consumption by 10-25%. However, since there is an increase in routing congestion, the applicability of this technique is limited.

To reduce power in the shift mode, various X-fill techniques have been used. These techniques reduce flip-flop switching activity but the peak power issue may still occur since the complete clock network is toggling simultaneously. Clock scheme modification techniques include modifying the clock scheme connected to the circuit under test and to the scan chains to either partially disable the clock signal or to reduce the clock rate during the test session without increasing the test time. Multi-duty scan architecture reduces the peak power issue by spreading the clock edges between different scan chains but it suffers from implementation complexity, and a delay may be introduced which may change over time based on processing operations and external factors.

SUMMARY

In view of the foregoing background, it is therefore an object of the present disclosure to reduce power consumption of an integrated circuit during a test mode without increasing the testing time and while being compatible with automatic test pattern generation (ATPG) algorithms.

This and other objects, features, and advantages in accordance with the present embodiments are provided by an integrated circuit comprising an N number of functional logic blocks, with N being greater than or equal to two, and internal clock signal generators to generate N capture clock signals for respective ones of the N functional logic blocks.

The integrated circuit may further comprise clock staggering test circuitry configured to operate in both a shift mode and a capture mode. When in the shift mode, the clock staggering test circuitry may generate N staggered shift clock signals for respective ones of the N functional logic blocks. Each of the N staggered shift clock signals may have a frequency equal to a frequency of an external test clock signal divided by M, where M is greater than or equal to N. When in the capture mode, the clock staggering test circuitry may be configured to stagger the N capture clock signals for respective ones of the N functional logic blocks. Peak power in both the shift mode and the capture mode is advantageously reduced based on the clock staggering provided by the clock staggering test circuitry.

The clock staggering test circuitry may generate the N staggered shift clock signals to be non-overlapping, and the N staggered capture clock signals to be non-overlapping. The non-overlapping capture clock signals may each comprise a plurality of successive capture clock pulses.

The clock staggering test circuitry may include a test clock pin configured to receive the external test clock signal. A test clock generator may be coupled to the test clock pin.

The integrated circuit may further comprise N internal on-chip clock signal (OCC) controllers coupled to the clock staggering test circuitry. Each internal clock signal controller may be configured to provide a staggered shift clock signal to a respective functional logic block when the clock staggering test circuitry is in the shift mode, and to provide the capture clock signal from to a respective functional block when the clock staggering test circuitry is in the capture mode. In the capture mode, there is no need for the external test clock signal to be pulsed at M times the frequency.

Another aspect is directed to a method for operating the integrated circuit with the clock staggering test circuitry as discussed above.

DETAILED DESCRIPTION OF THE EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

Figure 1:
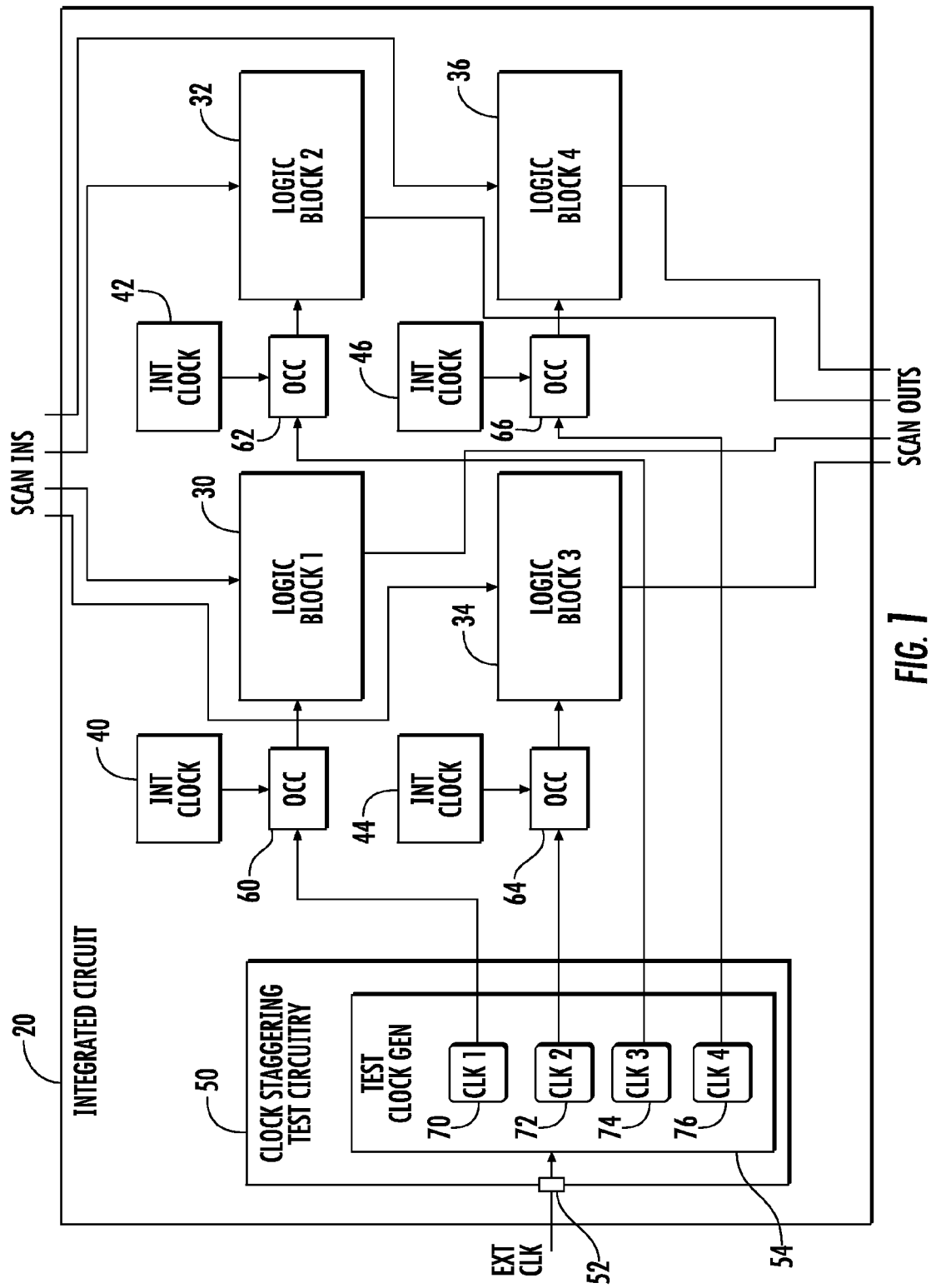
FIG. 1 is a block diagram of an integrated circuit with clock staggering test circuitry in accordance with the present disclosure.

Referring initially to FIG. 1, an integrated circuit 20 includes an N number of functional logic blocks 30-36, with N being greater than or equal to two, and internal clock signal generators 40-46 to generate N capture clock signals for respective ones of the N functional logic blocks. The integrated circuit 20 is also referred to as a system on a chip (SOC). Clock staggering test circuitry 50 is configured to operate in both a shift mode and a capture mode. When in the shift mode, the clock staggering test circuitry 50 generates N staggered shift clock signals for respective ones of the N functional logic blocks 30-36. Each of the N staggered shift clock signals has a frequency equal to a frequency of an external test clock signal divided by M, where M is greater than or equal to N. When in the capture mode, the clock staggering test circuitry 50 is configured to stagger the N capture clock signals for respective ones of the N functional logic blocks 30-36.

Peak power in both the shift mode and the capture mode is advantageously reduced based on the clock staggering provided by the clock staggering test circuitry 50. Clock staggering is compatible with standard automatic test pattern generation (ATPG), and does not impact the pattern count of test time.

The clock staggering test circuitry 50 generates the N staggered shift clock signals to be non-overlapping, and the N staggered capture clock signals to be non-overlapping. The non-overlapping capture clock signals each comprises a plurality of successive capture clock pulses.

The clock staggering test circuitry 50 includes a test clock pin 52 configured to receive the external test clock signal. A test clock generator 54 is coupled to the test clock pin and includes N shift clocks to generate the N shift clock signals. The test clock generator 54 includes N shift clocks 70-74 for providing the N staggered shift clock signals. In the shift mode, the external test clock signal operates on a higher frequency than the actual scan shift operation. As will be discussed in greater detail below, the external test clock signal is pulsed at M times the frequency, i.e., in every tester cycle the external test clock signal pulses only once. In most cases, M=N. However, there may be cases where M>N but N shift clock signals are still generated.

The integrated circuit 20 further includes N internal on-chip clock signal (OCC) controllers 60-64 coupled to the clock staggering test circuitry 50. Each internal clock signal controller 60-64 is configured to provide a staggered shift clock signal to a respective functional logic block 30-36 when the clock staggering test circuitry 50 is in the shift mode, and to provide the capture clock signal from to a respective functional block when the clock staggering test circuitry is in the capture mode. In the capture mode, there is no need for the external test clock signal to be pulsed at M times the frequency.

Figure 2:
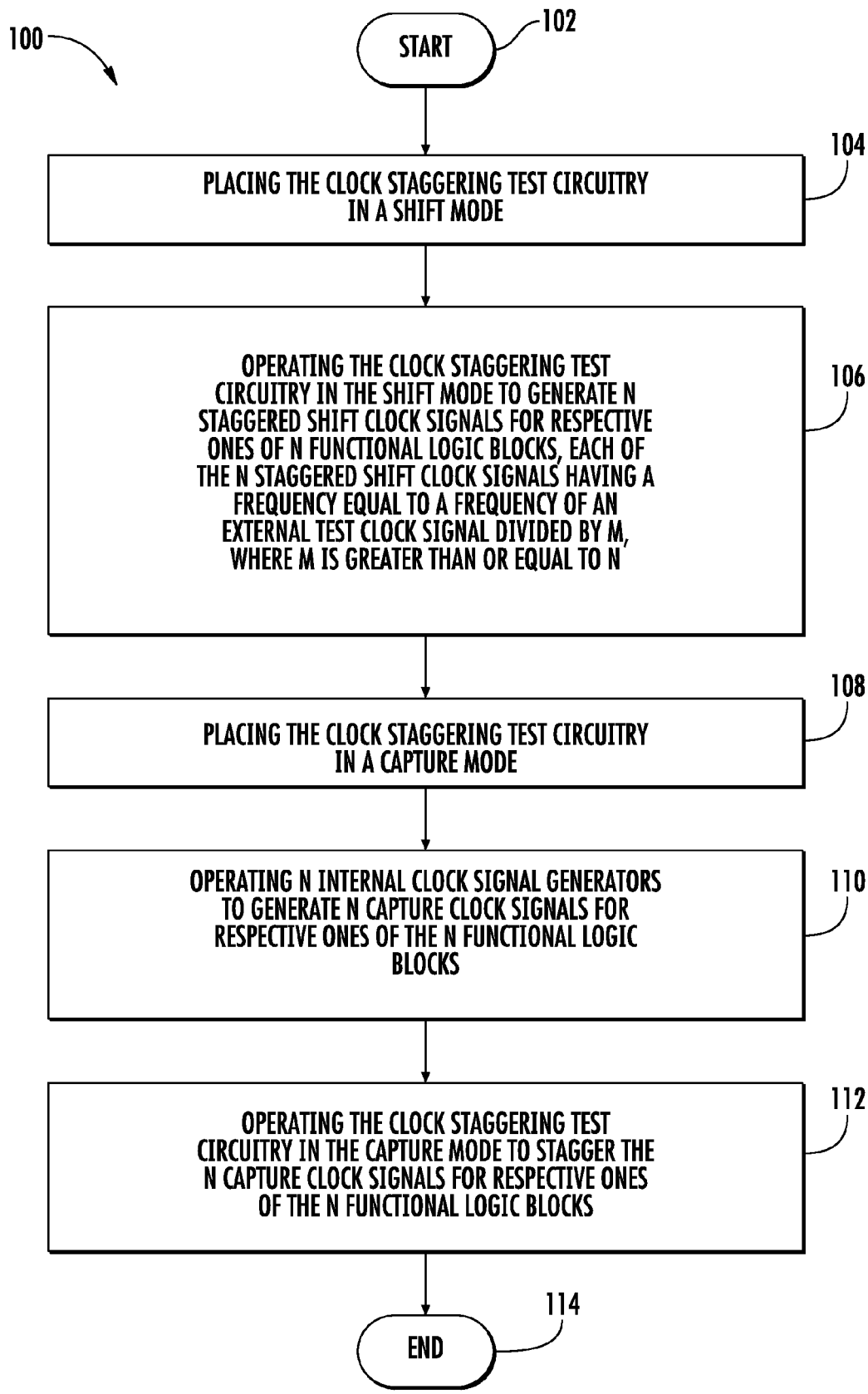
FIG. 2 is a flowchart illustrating a method for operating the integrated circuit with clock staggering test circuitry illustrated in FIG. 1.

Another aspect is directed to a method for operating the integrated circuit 20 with clock staggering test circuitry 50 as illustrated in FIG. 1. Referring now to the flowchart 100 in FIG. 2, the method comprises from the start (Block 102), placing the clock staggering test circuitry 50 in a shift mode at Block 104. When in the shift mode, N staggered shift clock signals are generated at Block 106 by the clock staggering test circuitry 50 for respective ones of the N functional logic blocks 30-36. Each of the N staggered shift clock signals has a frequency equal to a frequency of an external test clock signal divided by M, where M is greater than or equal to N. The clock staggering test circuitry 50 is placed in a capture mode at Block 108. At Block 110, N internal clock signal generators 40-46 are operated to generate N capture clock signals for respective ones of the N functional blocks 30-36. When in the capture mode, the clock staggering test circuitry 50 is configured at Block 112 to stagger the N capture clock signals for respective ones of the N functional logic blocks 30-36. The method ends at Block 114.

Reducing peak power in the shift mode will now be discussed in greater detail. Incorporation of the clock staggering test circuitry 50 in the integrated circuit 20 may not require any changes in the automatic test pattern generator (ATPG) algorithm, and the test time is not increased.

With non-staggered shift clock signals, the peak demand on the current drawn from the supply PADs of the integrated circuit 50 would primarily be concentrated near the rising-edge of the clock waveform. This could lead to a high current-resistance (IR) drop or power integrity issues. The rise in peak current poses a threat of unreliable circuit operation and may cause the test pattern to fail as the shifted data cannot be guaranteed.

Normally, the frequency of operation during the shift mode is much lower than the functional frequencies at which current designs can operate. One reason for this is that the switching activity during the shift mode is much higher as compared to the functional mode. This helps in maintaining the average shift mode power within acceptable limits. For illustration purposes, the shift frequency is 50 MHz. With a relatively relaxed shift time period, 50 MHz allows test engineers to pulse different blocks in the chip at skewed time intervals without exceeding the overall test application time.

Figure 3:
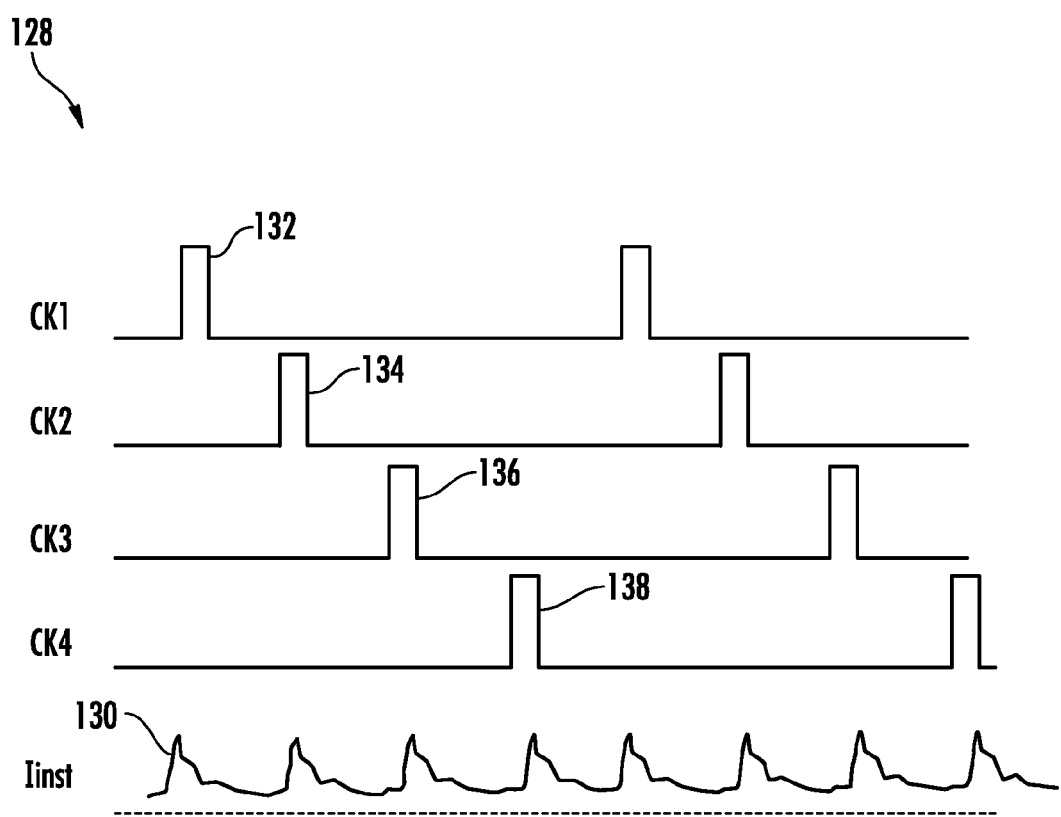
FIG. 3 is a plot of instantaneous current based on staggered shift clock signals in accordance with the present disclosure.

The waveform 130 of the current drawn from the supply PADs of the integrated circuit 20 based on a staggered shift clock signals for the shift mode is illustrated by the ply 128 in FIG. 3. The 4 functional logic blocks 30-36 are pulsed by the staggered shift clock signals CK1 132, CK2 134, CK3 136 and CK4 138 during the shift mode. As a result of the staggered shift clock signals, the effective peak current demand from the supply PAD could be reduced by up to a factor of 4 in such a case. The average power and test application time remains the same.

The clock staggering test circuitry 50 operates upon a single external test clock signal and generates the staggered shift clock signals with a deterministic skew between them. The clock staggering test circuitry 50 is capable of generating the required number of internal shift clock signals. For illustration purposes, the number of internal shift clock signals is 4, which reduces the peak power by a factor 4. This corresponds to the 4 functional logic blocks 30-36. For 3 functional logic blocks, the number of internal shift clock signals would be 3, which would reduce the peak power by a factor 3. The number of functional logic blocks is not limited to 3 or 4, and can vary between applications, as readily appreciated by those skilled in the art.

The functional logic blocks 30-36 are partitioned into 4 groups such that all are of similar size. This helps achieve similar power consumption across the shift clock signals.

The clock staggering test circuitry 50 operates on an external test clock signal operating on a higher frequency than the actual scan shift operation. If the scan shifting needs to be done at 50 MHz, for example, then the clock staggering test circuitry 50 operates on a 50×4=200 MHz external test clock signal. The input/output (IO) pads associated with the clock staggering test circuitry 50 can easily support clock signals at this frequency. The scan-in, scan-out and internal shifting will still operate at 50 MHz.

Figure 4:
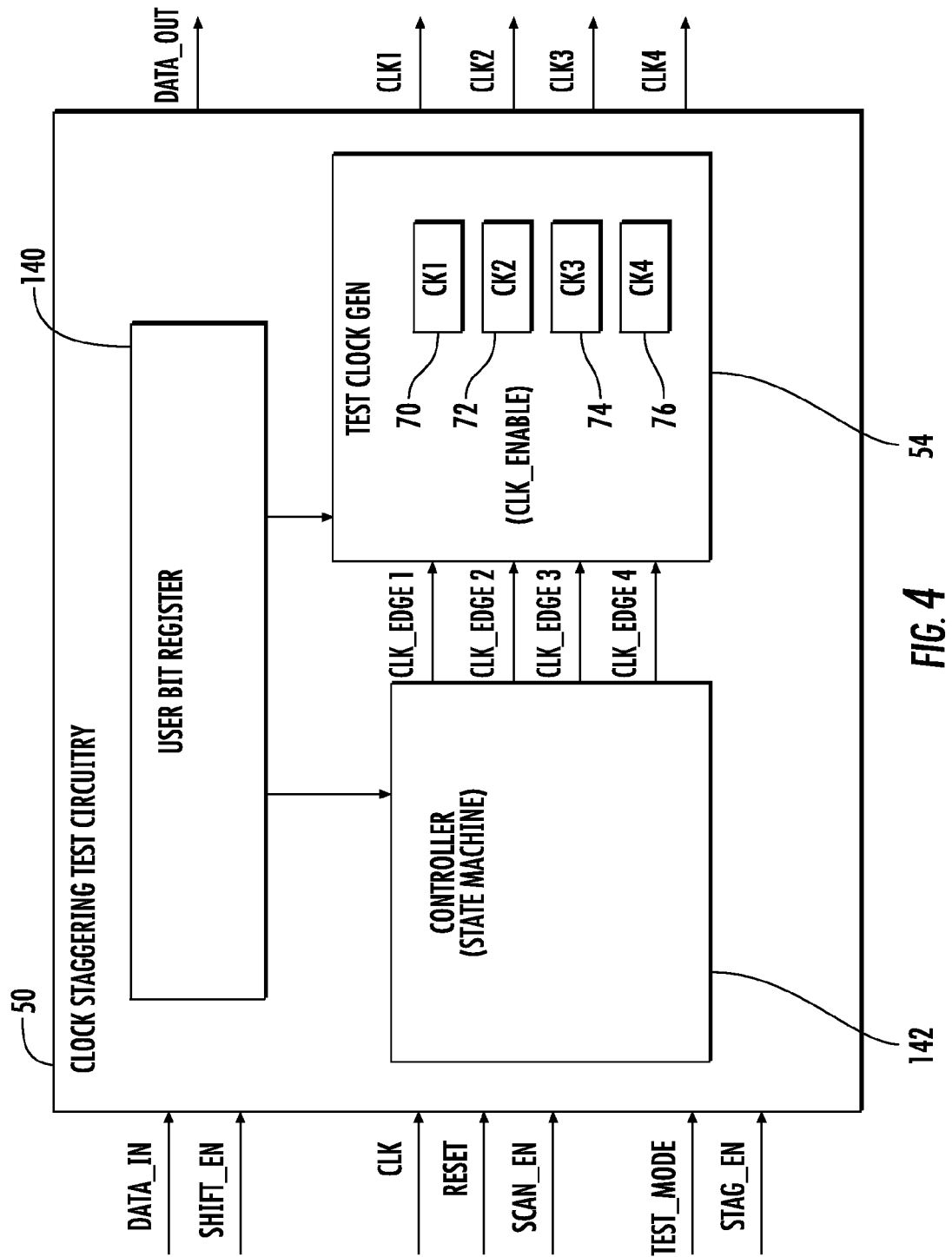
FIG. 4 is a more detailed block diagram of the clock staggering test circuitry illustrated in FIG. 1.

The clock staggering test circuitry 50 will now be discussed in greater detail in reference to FIG. 4. The clock staggering test circuitry 50 is configured as a programmable clock generator, and includes a user bit register 140. The user bit register 140 allows the clock staggering test circuitry 50 to be programmed in a particular mode of operation. Programming may be done before application of test patterns to the chip under test. Various other supported modes of operation will be discussed below.

The clock staggering test circuitry 50 includes a controller 142, a test clock generator 54 and the user bit register 140. The controller 142 may be a finite state machine encoded to traverse through various steps while application of the test pattern. The states are chosen internally depending upon the mode of operation as desired by the user. The states generate various signals at required time instances to generate the programmed staggered shift clock signals.

The test clock generator 54 includes shift clocks or clock gaters 70-76 to generate the staggered shift clock signals.

Each staggered shift clock signal is controlled through one dedicated clock gate cell whose enable is conditioned through the state machine.

The user bit register 140 is a serial register used to program the desired operation. This allows the user to configure the clock staggering test circuitry 50 based on the user requirements. The user bit register 140 includes a Data_in interface, a Data_out interface and a Shift_en interface to provide flexibility for programming the registers via JTAG interface. The Test_mode is a static signal and can be shared with the already existing test mode port for the chip. The Static pin Stag_en is the enable for the clock staggering test circuitry 50. If it is not asserted, then the clock staggering test circuitry 50 remains in an inactive state and it bypasses the external test clock signal to each of the 4 generated shift clock signals, i.e., CK1, CK2, CK3 and CK4 without staggering. Scan_en is the Scan enable signal which allows the clock staggering test circuitry 50 to distinguish between the shift and capture modes.

TABLE I provides the user bit names and their associated function for the clock staggering test circuitry 50. These bits are programmed before the scan test is enabled. The bits are required to maintain their value throughout an ATPG run. The shift mode related user bit configuration will now be discussed, followed by discussion of the remaining capture mode specific user bits.

TABLE 1

| NAME | SIZE | FUNCTION |
| --- | --- | --- |
| stag_shift | 1 | 0 means no shift staggering |
| stag_capture | 1 | 0 means no Capture staggering |
| clk_enable | 4 | 0000 -> all clocks ON<br>1111 -> all clocks ON |
| clk1_sample_edge | 2 | Sample edge for clock 1<br>00-$1^{st}$ Edge, 01-$2^{nd}$ Edge,<br>10-$3^{rd}$ Edge, 11-$4^{th}$ Edge |
| clk2_sample_edge | 2 | Sample edge for clock 2<br>00-$1^{st}$ Edge, 01-$2^{nd}$ Edge,<br>10-$3^{rd}$ Edge, 11-$4^{th}$ Edge |
| clk3_sample_edge | 2 | Sample edge for clock 3<br>00-$1^{st}$ Edge, 01-$2^{nd}$ Edge,<br>10-$3^{rd}$ Edge, 11-$4^{th}$ Edge |
| clk4_sample_edge | 2 | Sample edge for clock 4<br>00-$1^{st}$ Edge, 01-$2^{nd}$ Edge,<br>10-$3^{rd}$ Edge, 11-$4^{th}$ Edge |
| capture_cycles | 4 | Number of slow capture pulses for each clock |

The bit stag_shift enables the staggering of the shift clock signals. In case this bit is 0, each of the shift clock signals generated are pulsed simultaneously without staggering. This particular mode can be useful when a known amount of skew is already present in the clock tree path of each of the generated shift clock signals. This can be true when all the individual shift clock signals are not balanced with each other or a deliberate skew is introduced. This useful skew could be utilized to reduce or minimize peaks in shift mode power without staggering all of the shift clock signals.

The clk_enable is a 4-bit register, where each bit tells if a particular clock signal would be pulsed at the output or not. A value of 1111 means all four shift clock signals, namely, CK1, CK2, CK3 and CK4 would be pulsed. Their function is independent of whether the user intends to stagger the shift clocks or not, i.e., stag_shift bit. This is useful when a sequential test is being performed where a particular functional logic block is not scanned during test while others are scanned. This function can be achieved even with a single top level shift clock signal. For example, when only shift clock signals CK1, CK3 are needed to be pulsed and shift clock signals CK2, CK4 do not need to be pulsed, a value of 1010 in the clk_enable register would be programmed.

To enable shift staggering, an external test clock signal from the tester would be pulsed at a frequency 4 times the intended internal scan shift speed. That is, for each tester cycle, the external test clock signal pulses 4 times. Each of the staggered shift clock signals will, however, pulse only once in a tester period.

User bit register clk1_sample_edge is a 2-bit register which selects the sample edge to be pulsed. A value of 00 selects the first edge of the external test clock signal while a value of 11 selects the $4^{th}$ edge. This programmability is given corresponding to each shift clock output signal via user bit registers, namely, clk1_sample_edge, clk2_sample_edge, clk3_sample_edge, and clk4_sample_edge as shown in TABLE I.

Figure 5:
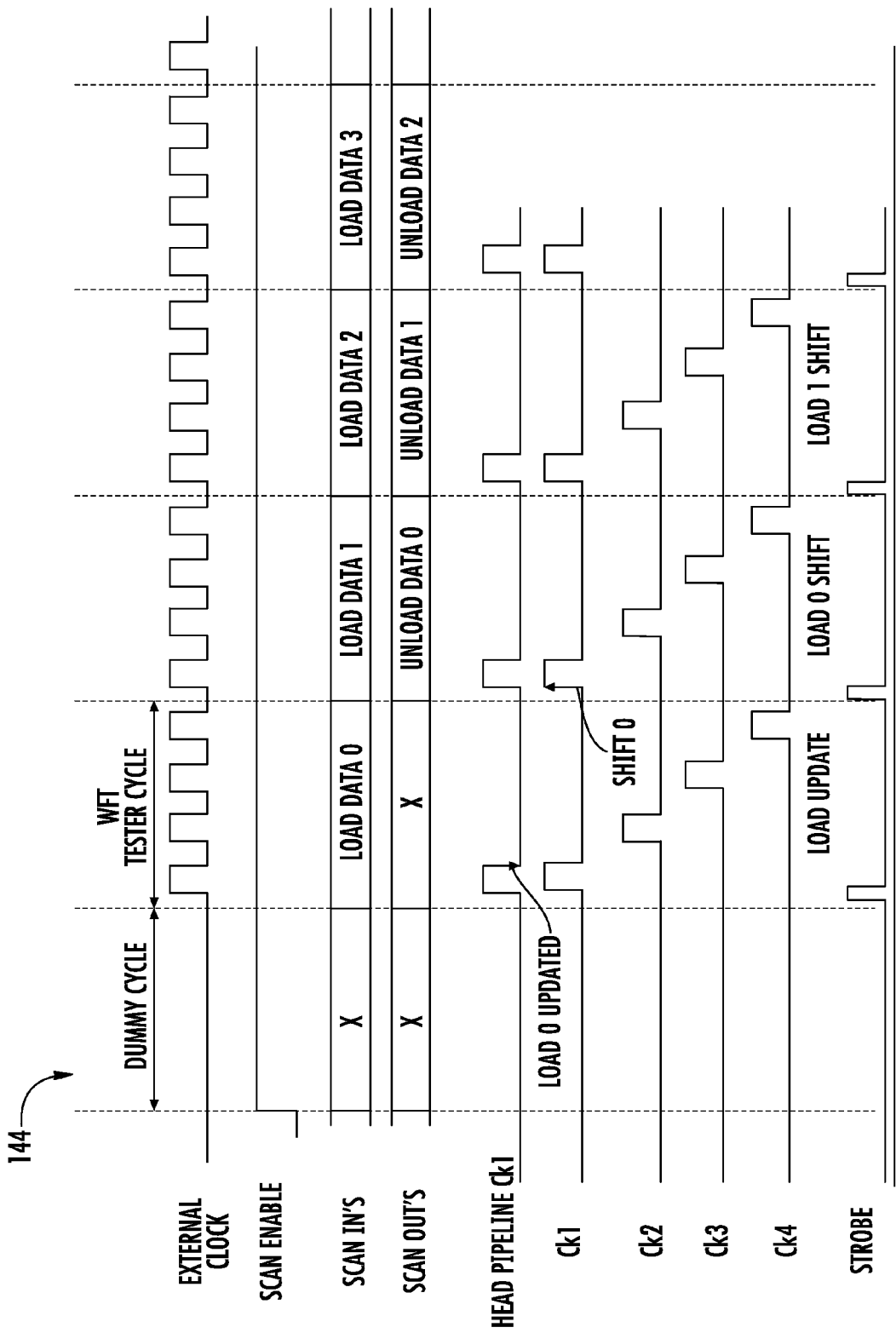
FIG. 5 is timing diagram illustrating timing of the staggered shift clock signals for the integrated circuit with clock staggering test circuitry illustrated in FIG. 1.

Referring now to the timing diagram 144 in FIG. 5, timing waveforms with the staggered shift clock signals is based on the user bits being programmed with the following:

stag_shift = 1
clk_enable = 1111
clk1_sample_edge = 00 ($1^{st}$ Edge)
clk2_sample_edge = 01 ($2^{nd}$ Edge)
clk3_sample_edge = 10 ($3^{rd}$ Edge)
clk4_sample_edge = 11 ($4^{th}$ edge)

The start of a test vector is signaled with the transition of the Scan enable going from 0 to 1. As the controller 142 recognizes this transition, one clock pulse is generated for each CK1, CK2, CK3 or CK4 per tester period, depending upon the programmed edge. In the illustrated embodiment, all the shift clock signals are staggered to different sample edges. The strobing of the Scan-outs and changing of the Scan-ins occur at the beginning of each tester cycle. Preferably, each shift clock signal is pulsed after the strobing time. This ensures that, even if the shift clock signals are staggered, it does not affect the integrity of the ATPG test patterns.

Flexibility is also provided to selectively choose which shift clock signals are to be staggered. For example, 2 out of 4 clocks can be chosen for staggering. If, CK1 and CK2 domain already have some insertion delay in their shift clock signal path, then there is no need to stagger them with respect to each other. In this case, clk1_sample_edge and clk2_sample_edge would be programmed with 00 each.

The controller 142 generates the shift clock signals on different clock edges of the external test clock signal. The sampled edge for each shift clock signal is programmable using a 2 bit register. The sampled edge is chosen after calculating the insertion delay of each shift clock signal, once the functional logic blocks 30-36 have been routed. The values are chosen such that there is no overlapping between any two or more shift clock signals.

Since the shift clock signals are non-overlapping, this results in a reduction of the peak power. This technique can be used along with other software techniques, like X-filing or scan re-ordering, to reduce the average power as well. At the end of each shift mode, when Scan enable goes from 1 to 0, the clock staggering test circuitry 50 ignores the shift mode user bits and switches to the capture clock generation based on the capture mode user bits.

To reduce the power during capture mode, the clock staggering in the shift mode is extended to the capture mode. This likewise reduces the peak capture power by a factor of 4, and is compatible with existing techniques of power reduction in the capture mode.

Before describing the capture clock staggering technique, the fundamentals of the on-chip clock controller (OCC) 60-64 will be discussed first. An OCC 60-64 is used to manage the clock signal pulsing to the functional logic blocks 30-36 during the test mode. At the heart of an OCC 60-64 is multiplexing logic that switches the output from a slow tester clock, i.e., slow_clk during the shift mode, to a programmable fast functional clock signal generated by a phase locked loop (PLL) during the capture phase, i.e., fast_clk. The PLLs correspond to the internal clocks 40-46.

Figure 6:
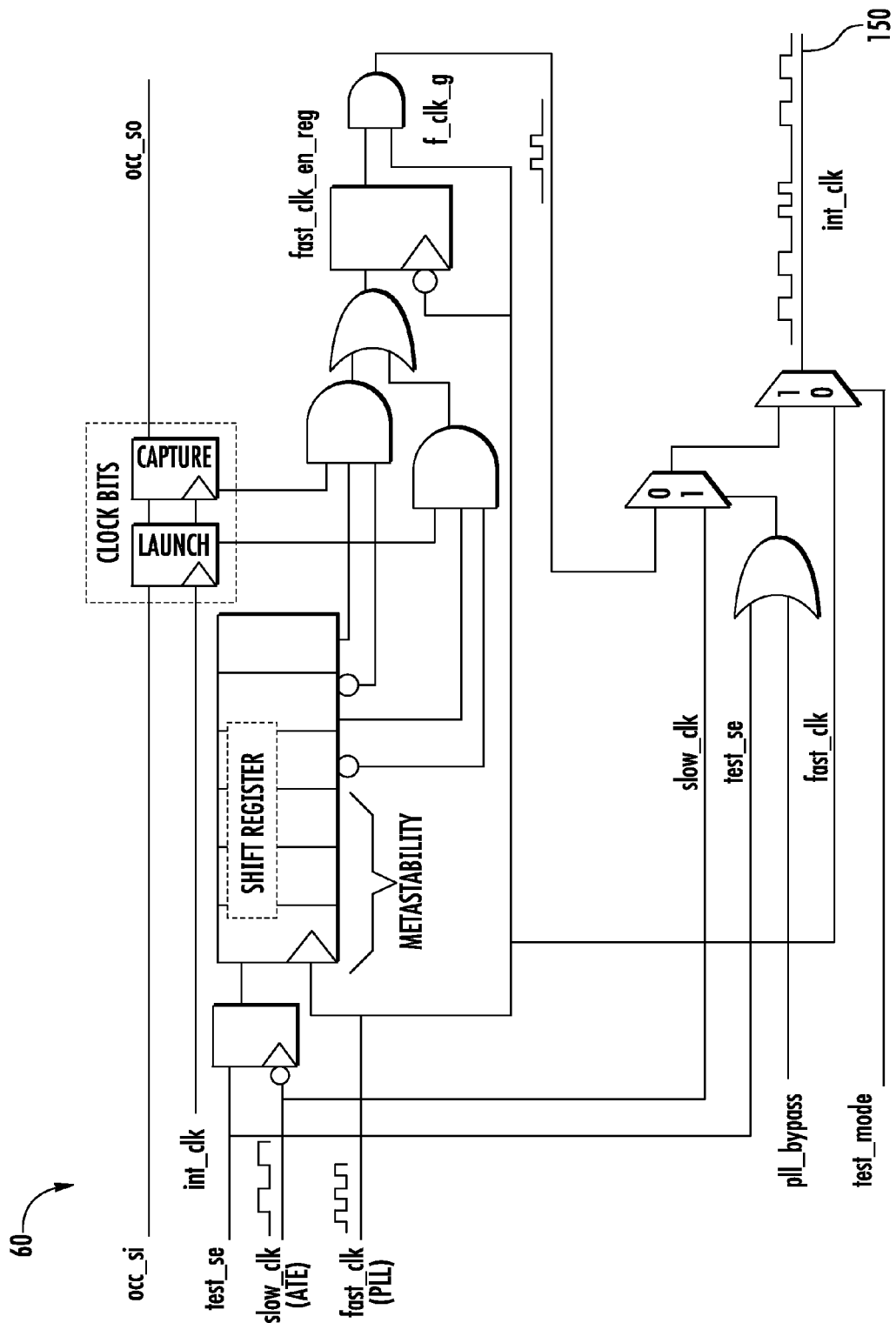
FIG. 6 is a more detailed block diagram of the on-chip clock controller (OCC) illustrated in FIG. 1.

There are numerous possible implementations for an OCC 60-64. An example schematic of one such implementation will now be discussed in reference to in FIG. 6. In the functional mode, i.e., test_mode (TM)=0, the OCC 60-64 is bypassed and is phase locked loop (PLL) clocked, i.e., fast_clk directly feeds the functional logic block 30-36. In the scan test mode, i.e., test mode=1, the output clock 150 depends on the scan enable (SE) logic value. During the shift mode, i.e., SE=1, the OCC 60-64 selects the slow ATE clock, i.e., slow_clk. In the capture mode, i.e., SE=0, and the OCC 60-64 pulses the required at-speed pulses of fast_clk.

Figure 7:
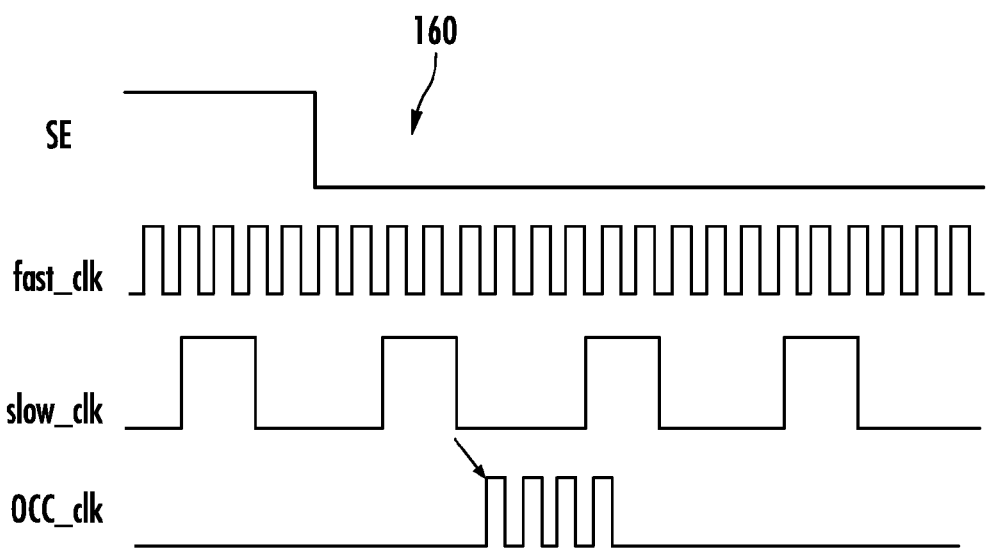
FIG. 7 is timing diagram illustrating timing of a capture clock signal as provided by the OCC illustrated in FIG. 6.

When SE goes from 1 to 0, the SE signal is latched on slow_clk and synchronized internally to the fast_clk before the capture pulses are generated at the output. This means that the OCC 60-64 waits for at least 1 slow_clk cycle before it pulses the fast_clk at its output 150. An example clock waveform for an OCC capture mode is illustrated by the timing diagram 160 in FIG. 7. The arrow 152 signifies the negative edge of the slow_clk during the capture mode and triggers the fast clock generation shown as signal OCC_clk. Thus, the slow_clk is used as an enable signal during the capture mode operation. This forms the basis of the capture clock staggering technique.

The fast_clk signal corresponds to the external test clock signal, the slow_clk signal corresponds to the internal clock signals provided by the PLLs 40-46, and the OCC_clk is the resulting capture clock signal provided by the OCC 60-66. The staggered shift clock signals CK1, CK2, CK3 and CK4 thus drive the respective 'slow_clk' inputs of the OCCs 60-66 inside the partitions of the functional logic blocks 30-36. By staggering the slow_clk of each of the partitions during the capture mode, the fast OCC output clocks between different partitions are also rendered staggered. However, the fast OCC clocks within each partition are not staggered. By enabling capture clocks of one partition at a time, the peak power is expected to reduce by a factor of 4.

The method of capture clock staggering is different from the shift mode. Compared to the shift clock staggering, here there is no need for the external test clock signal to be pulsed at 4 times the frequency, i.e., in every tester cycle. Instead, the external test clock signal pulses only once.

Figure 8:
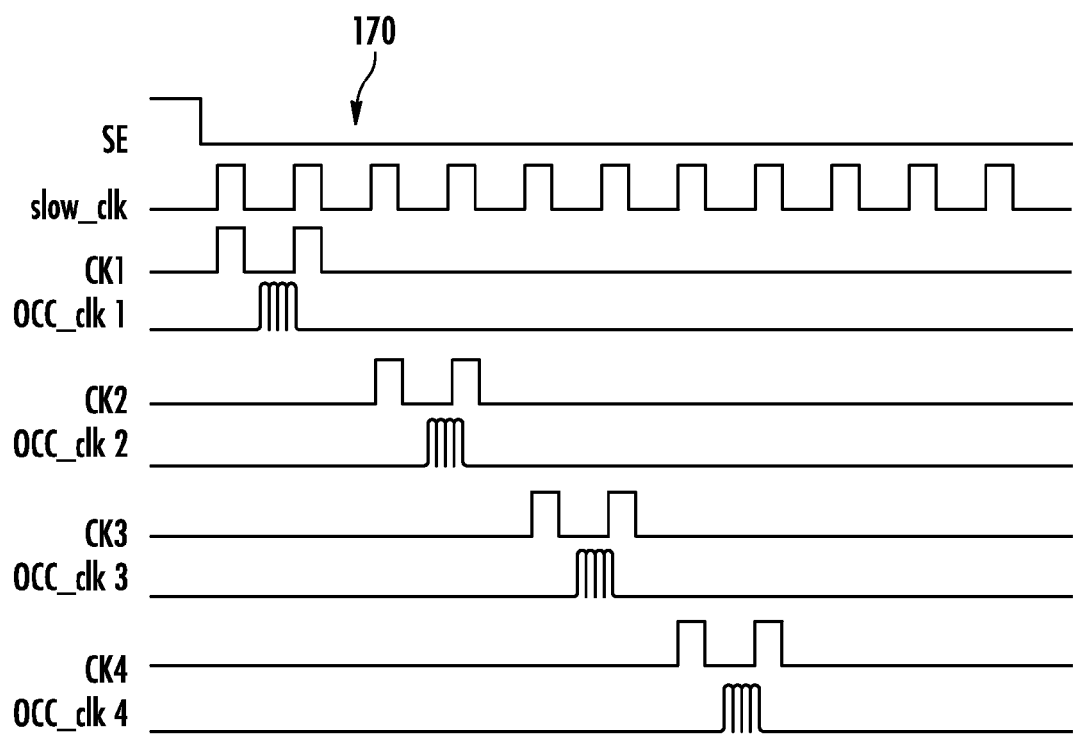
FIG. 8 is timing diagram illustrating timing of the staggered capture clock signals for the integrated circuit with clock staggering test circuitry illustrated in FIG. 1.

For the staggered capture clock signals, clock output CK1 pulses for 2 cycles only, then CK2 pulses for 2 cycles and so on, as illustrated by the timing diagram 170 in FIG. 8. The advantage of this kind of staggering will be evident by observing the waveform of the clock signal 150 generated at the output of each of the OCCs 60-66. As already established before, the slow_clk during the capture mode enables the clock generation in an OCC 60-66. At any instant, only OCCs 60-66 of one partition of the functional logic blocks 30-36 are active during the capture mode. The waveforms in FIG. 8 show the deterministic skews between the OCC's clock outputs.

Inside the clock staggering test circuitry 50, when the SE transits from 1 to 0, the controller 142 recognizes it and begins to traverse the states depending upon the capture mode user bits. As previously discussed, there are certain user bit registers reserved for the capture mode operation.

TABLE I describes all the user bit registers. The stag_capture bit enables the clock staggering in the capture mode, and when left inactive, the external slow clock is bypassed to the 4 outputs of the clock staggering test circuitry 50, namely CK1, CK2, CK3 and CK4, and no staggering is produced. The 4-bit register capture_cycles allows a test engineer to have the flexibility to program the number of slow clock pulses for each clock output.

Since it is not desired to overlap the pulsing of fast OCC clocks during capture, each OCC 60-66 can remain active for a desired number of slow clock cycles till the user is certain that the OCC has finished pulsing its fast clocks. In the above example, this value is 2. The value can be increased in case the number of fast clock cycles is greater or the frequency of the fast clock is comparable to the slow clock. Since testing at-speed defects on inter-clock domain paths is not a concern, the order of pulsing the slow_clk of OCCs is irrelevant.

Application of the clock staggering test circuitry 50 to an industrial design in 32 nm will now be discussed. The design contained predominantly 4 functional logic blocks, i.e., cores, and some top level logic. The chip design details are as follows:

| | |
|---|---|
| Application | Networking |
| Process | 32 nm |
| Voltage Range | 1.15 V |
| Frequency | 333 MHz |
| Complexity | 18M instances |
| DFT Methodology | Full Scan, Scan Compression 60X |
| Number of Flops | 2.4M |
| Number of clock domains | 1 |
| Number of clock gaters | 55K |

The design was virtually partitioned into four blocks for staggering the shift and capture clock signals. Each core was treated as a separate partition and one OCC was inserted in each core. The clock staggering test circuitry as inserted for the top level clock produced four staggered shift clock signals.

The power specification for the integrated circuit was 18 W at worst with an 8.5% switching activity in the functional mode. With only one partition clocked at a time, the 18 W of power resulted in 32% switching activity per partition. A transition fault model ATPG was run to compare the results of the flow with the standard ATPG and an industry wide used low power ATPG that uses clock gating cells to limit the switching activity within the defined budget. The transition fault model ATPG is referred as CG budget ATPG.

In the CG budget ATPG, an X-fill algorithm was also activated to reduce the shift switching activity. For the standard ATPG and CG budget ATPG runs, the clock staggering test circuitry was forced in a bypass mode. For the CG LP ATPG flow, a power budget of 8.5% was used to keep the power consumption within the specifications. For the ATPG flow, a standard ATPG pattern was used but with the clock staggering test circuitry in an active mode. A False_path command was set between the different staggered clocks, advising the tool to mask any transition on nets on inter clock paths. As the clock staggering test circuitry generates four stagger clocks, both in shift and capture mode, the peak power is expected to reduce approximately by 75%.

The ATPG results are presented in Table II. The permissible peak capture switching activity with four cores pulsed simultaneously and only one core pulse is calculated as 8.5% and 32% respectively. Peak capture switching activity of 25.84% in standard ATPG is well above the limit of 8.5% and the patterns will exceed the power consumption; hence they are risky for silicon testing. CG based ATPG was able to maintain the capture switching activity of 8.5% but generated 2.74× more patterns with a slight coverage loss of 0.05% as compared to standard ATPG results. The shift switching activity was reduced to 39.74%, which also highlight limited efficiency of X-fill algorithm with high scan compression.

The flow with the clock staggering test circuitry generates standard ATPG patterns with the exception of transition masking on paths between staggered clock signals. The staggered ATPG flow generated patterns with a slight coverage loss of 0.02%. The average switching activity for the staggered ATPG is similar to a standard ATPG while the peak shift and capture and average capture switching activity has reduced considerably due to clock staggering feature.

The average shift switching could be reduced by using the X-fill algorithm but it was not used. For the staggered flow, the average shift switching activity is measured by adding the individual switching activity of the four internal clock signals over the tester period while the peak is the maximum value of the individual switching; hence average switching is reported higher than the peak switching activity.

TABLE II

| Quality Parameter | Standard ATPG | CG based ATPG | Staggered ATPG |
|---|---|---|---|
| Test Coverage | 87.18% | 87.13% | 86.16% |
| Pattern Count | 137K | 376K | 136K |
| Allowed capture SA | 8.5% | 8.5% | 32% |
| Average Capture SA | 15.91% | 5.24% | 3.98% |
| Peak Capture SA | 25.84% | 8.46% | 6.46% |
| Average Shift SA | 46.81% | 36.15% | 46.80% |
| Peak Shift SA | 55.24% | 39.74% | 13.81% |
| Run Time | | 3X | 1X |
| Pattern Inflation | — | 2.74X | 1X |

To appraise the power consumption, dynamic IR drop analysis was done on the ATPG vector having the peak switching activity, both from CG based ATPG and clock staggering block based ATPG flow. For reference, IR drop analysis of functional vector was also performed. TABLE III presents the peak current demand and peak dynamic voltage drop obtained for the three cases.

TABLE III

| Quality Parameter | Functional Mode | Standard ATPG | CG based ATPG | Staggered ATPG |
|---|---|---|---|---|
| Peak Current demand | 6.5 A | 8.9 A | 8.6 A | 4.9 A |
| Peak Dynamic Voltage drop | 130 mV | 230 mV | 225 mV | 115 mV |

As discussed above, deterministic on-chip clock staggering has been provided for catering the peak power needs both in shift and capture modes for low power designs. The clock staggering test circuitry 50 generates multiple staggered shift clock signals by sampling the external test clock signal, i.e., fast clock, on the programmed edge. During the capture mode, the clock staggering test circuitry 50 utilizes the on-chip clock controllers 60-66 and enables them serially to reduce the peak power issue. The CAD results show that the clock staggering test circuitry 50 reduces peak switching activity by more than 70% on 32 nm designs. The clock staggering test circuitry 50 is compatible with the existing standard ATPG patterns and does not impact the test data volume or test time. The clock staggering test circuitry 50 can be used in conjunction with other known techniques to further reduce peak and average power, both for the shift and capture modes.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

That which is claimed is:

1. An integrated circuit comprising:
   N number of functional logic blocks, with N being greater than or equal to two, and with said N number of functional logic blocks configured to receive scan-ins and generate scan-outs during testing; and
   clock staggering test circuitry, when in a shift mode, configured to generate N staggered shift clock signals for respective ones of said N functional logic blocks, each of the N staggered shift clock signals having a frequency equal to a frequency of an external test clock signal divided by M, where M is greater than or equal to N.

2. The integrated circuit according to claim 1 wherein said clock staggering test circuitry generates the N staggered shift clock signals to be non-overlapping.

3. The integrated circuit according to claim 1 wherein said clock staggering test circuitry comprises:
   a test clock pin configured to receive the external test clock signal; and
   a test clock generator coupled to said test clock pin.

4. The integrated circuit according to claim 1 further comprising N internal clock signal generators configured to generate N capture clock signals for respective ones of said N functional logic blocks; and wherein said clock staggering test circuitry, when in a capture mode, is configured to stagger the N capture clock signals for respective ones of said N functional logic blocks.

5. The integrated circuit according to claim 4 further comprising N internal clock signal controllers coupled to said clock staggering test circuitry, each internal clock signal controller configured to provide a staggered shift clock signal to a respective functional logic block when said clock staggering test circuitry is in the shift mode; and provide the capture clock signal from to a respective functional logic block when said clock staggering test circuitry is in the capture mode.

6. The integrated circuit according to claim 5 wherein said clock staggering test circuitry is configured to stagger the N capture clock signals to be non-overlapping.

7. The integrated circuit according to claim 6 wherein the non-overlapping capture clock signals each comprises a plurality of successive capture clock pulses.

8. An integrated circuit comprising:
N number of functional logic blocks, with N being greater than or equal to two, and with said N number of functional logic blocks configured to receive scan-ins and generate scan-outs during testing;
N internal clock signal generators configured to generate N capture clock signals for respective ones of said N functional logic blocks; and
clock staggering test circuitry,
when in a shift mode, configured to generate N staggered shift clock signals for respective ones of said N functional logic blocks, each of the N staggered shift clock signals having a frequency equal to a frequency of an external test clock signal divided by M, where M is greater than or equal to N, and
when in a capture mode, is configured to stagger the N capture clock signals for respective ones of said N functional logic blocks.

9. The integrated circuit according to claim 8 wherein said clock staggering test circuitry generates the N staggered shift clock signals to be non-overlapping, and the N staggered capture clock signals to be non-overlapping.

10. The integrated circuit according to claim 9 wherein the non-overlapping capture clock signals each comprises a plurality of successive capture clock pulses.

11. The integrated circuit according to claim 8 wherein said clock staggering test circuitry comprises:
a test clock pin configured to receive the external test clock signal; and
a test clock generator coupled to said test clock pin.

12. The integrated circuit according to claim 11 further comprising N internal clock signal controllers coupled to said clock staggering test circuitry, each internal clock signal controller configured to
provide a staggered shift clock signal to a respective functional logic block when said clock staggering test circuitry is in the shift mode; and
provide the capture clock signal from to a respective functional block when said clock staggering test circuitry is in the capture mode.

13. The integrated circuit according to claim 8 wherein said N number of functional logic blocks, said N internal clock signal generators and said clock staggering test circuitry are configured so that the integrated circuit is a system on chip (SOC).

14. A method for operating an integrated circuit comprising an N number of functional logic blocks, and clock staggering test circuitry coupled thereto, with N being greater than or equal to two, and with the N number of functional logic blocks being configured to receive scan-ins and generate scan-outs during testing, the method comprising:
when the clock staggering test circuitry is in a shift mode, generating N staggered shift clock signals for respective ones of the N functional logic blocks, each of the N staggered shift clock signals having a frequency equal to a frequency of an external test clock signal divided by M, where M is greater than or equal to N.

15. The method according to claim 14 wherein the N staggered shift clock signals are non-overlapping.

16. The method according to claim 14 wherein the clock staggering test circuitry comprises a test clock pin, and a test clock generator coupled to the test clock pin, the method further comprising:
receiving an external test clock signal at the test clock pin; and
operating the test clock generator to provide the N staggered shift clock signals based on the external test clock signal.

17. The method according to claim 14 wherein the clock staggering test circuitry further comprises N internal clock signal generators, the method further comprising:
operating the N internal clock signal generators to generate N capture clock signals for respective ones of the N functional logic blocks; and
when the clock staggering test circuitry is in a capture mode, staggering the N capture clock signals for respective ones of the N functional logic blocks.

18. The method according to claim 17 wherein the clock staggering test circuitry further comprise N internal clock signal controllers coupled to the clock staggering test circuitry, the method further comprising operating each internal clock signal controller for
providing a staggered shift clock signal to a respective functional logic block when the clock staggering test circuitry is in the shift mode; and
providing the capture clock signal to a respective functional logic block when the clock staggering test circuitry is in the capture mode.

19. The method according to claim 18 wherein the N staggered capture clock signals are non-overlapping.

20. The method according to claim 19 wherein the non-overlapping capture clock signals each comprises a plurality of successive capture clock pulses.

* * * * *

UNITED STATES PATENT AND TRADEMARK OFFICE
CERTIFICATE OF CORRECTION

PATENT NO.       : 8,917,123 B2                          Page 1 of 1
APPLICATION NO.  : 13/853247
DATED            : December 23, 2014
INVENTOR(S)      : Bahl et al.

It is certified that error appears in the above-identified patent and that said Letters Patent is hereby corrected as shown below:

In the Claims

Column 13, Line 4        Delete: "from"

Column 13, Line 50       Delete: "from"

Signed and Sealed this
Eleventh Day of August, 2015

Michelle K. Lee
*Director of the United States Patent and Trademark Office*